(12) United States Patent
Haiberger et al.

(10) Patent No.: US 11,069,844 B2
(45) Date of Patent: Jul. 20, 2021

(54) LIGHT EMITTING DEVICE AND METHOD FOR MANUFACTURING LIGHT EMITTING DEVICE

(71) Applicant: OSRAM Opto Semiconductors GmbH, Regensburg (DE)

(72) Inventors: Luca Haiberger, Regensburg (DE); Sam Chou, Regensburg (DE); Martin Brandl, Kelheim (DE)

(73) Assignee: OSRAM OLED GMBH, Regensburg (DE)

( * ) Notice: Subject to any disclaimer, the term of this patent is extended or adjusted under 35 U.S.C. 154(b) by 15 days.

(21) Appl. No.: 16/382,008

(22) Filed: Apr. 11, 2019

(65) Prior Publication Data
US 2019/0326490 A1   Oct. 24, 2019

(30) Foreign Application Priority Data
Apr. 20, 2018   (DE) .......................... 102018109542.2

(51) Int. Cl.
*H01L 33/60* (2010.01)
*H01L 33/48* (2010.01)
(Continued)

(52) U.S. Cl.
CPC .............. *H01L 33/60* (2013.01); *H01L 33/44* (2013.01); *H01L 33/483* (2013.01); *H01L 33/50* (2013.01);
(Continued)

(58) Field of Classification Search
CPC ............. F21Y 2115/10; G02B 27/0961; H01L 2933/0025; H01L 2933/0058; H01L 33/44;
(Continued)

(56) References Cited

U.S. PATENT DOCUMENTS 5,907,151 A     5/1999   Gramann et al.
6,154,362 A *  11/2000   Takahashi ................ G09F 9/33
                                                           361/695
(Continued)

FOREIGN PATENT DOCUMENTS

DE          19621124 A1   11/1997
DE      102012107547 A1    2/2013
(Continued)

OTHER PUBLICATIONS

Christian Gierl, et. al., "Tuneable VCSEL aiming for the application in interconnects and short haul systems," Invited Paper, Optical Metro Networks and Short-Haul Systems III, Proc. of SPIE vol. 7959, pp. 1-13, 2011.

*Primary Examiner* — Jaehwan Oh
(74) *Attorney, Agent, or Firm* — Slater Matsil, LLP

(57) ABSTRACT

A light-emitting device and a method for manufacturing a light emitting device are disclosed. In an embodiment a light-emitting device includes a light-emitting semiconductor chip having a light-outcoupling surface and an optical element arranged on the light-outcoupling surface, wherein the light-emitting semiconductor chip is laterally surrounded by a frame element in a form-locking manner, wherein the optical element is mounted on the frame element, wherein the frame element projects beyond the light-outcoupling surface in a vertical direction such that a gas-filled gap is present at least in a partial region between the light-outcoupling surface and the optical element, and wherein the frame element has a channel connecting the gap to an atmosphere surrounding the light-emitting device.

15 Claims, 5 Drawing Sheets

(51) Int. Cl.
*H01L 33/44* (2010.01)
*H01L 33/50* (2010.01)

(52) U.S. Cl.
CPC ............. *H01L 2933/0025* (2013.01); *H01L 2933/0058* (2013.01)

(58) Field of Classification Search
CPC ....... H01L 33/483; H01L 33/50; H01L 33/56; H01L 33/58; H01L 33/60
See application file for complete search history.

(56) References Cited

U.S. PATENT DOCUMENTS

| | | | |
|---|---|---|---|
| 9,012,950 | B2 | 4/2015 | Choi |
| 9,324,920 | B2* | 4/2016 | Sabathil ................. H01L 33/20 |
| 2006/0054915 | A1* | 3/2006 | Chang .................. H01L 33/642 257/100 |
| 2010/0237368 | A1 | 9/2010 | Kojima et al. |
| 2011/0122630 | A1* | 5/2011 | Tan ......................... F21V 29/74 362/294 |
| 2011/0299280 | A1* | 12/2011 | Maeers ................... F21S 8/026 362/249.02 |
| 2012/0120647 | A1* | 5/2012 | Li ........................ G02B 27/149 362/230 |
| 2013/0099665 | A1* | 4/2013 | Anderson ............... F21K 9/232 315/51 |
| 2014/0247606 | A1* | 9/2014 | Chen ......................... F21K 9/90 362/363 |
| 2014/0293588 | A1* | 10/2014 | Chang .................. F21V 21/084 362/103 |
| 2015/0085503 | A1* | 3/2015 | Na ........................... F21V 29/74 362/373 |
| 2015/0109765 | A1* | 4/2015 | Sepkhanov ............. F21V 29/83 362/147 |
| 2015/0147240 | A1* | 5/2015 | Chang ..................... H01L 33/44 422/186 |
| 2015/0326767 | A1 | 11/2015 | Kim |
| 2016/0123569 | A1* | 5/2016 | Cummings .............. F21S 2/005 362/249.02 |
| 2017/0084803 | A1* | 3/2017 | Iwaki ...................... H01L 33/60 |
| 2017/0148966 | A1 | 5/2017 | Schwarz et al. |
| 2019/0293622 | A1* | 9/2019 | Fuchs ....................... B01L 3/00 |
| 2019/0326339 | A1* | 10/2019 | Dong ................. G06K 9/00013 |

FOREIGN PATENT DOCUMENTS

| | | |
|---|---|---|
| DE | 102014108368 A1 | 12/2015 |
| EP | 1467417 A2 | 10/2004 |
| WO | 2018133940 A1 | 7/2018 |

\* cited by examiner

LIGHT EMITTING DEVICE AND METHOD FOR MANUFACTURING LIGHT EMITTING DEVICE

CROSS-REFERENCE TO RELATED APPLICATIONS

This application claims the priority to German patent application 102018109542.2, filed on Apr. 20, 2018, which application is hereby incorporated herein by reference.

TECHNICAL FIELD

A light-emitting device and a method for manufacturing a light-emitting device are specified.

BACKGROUND

Light-emitting diode chips typically require very little space, since the area for mounting required by a light-emitting diode chip is very small. For a device in which a light-emitting diode chip is to be provided together with an integrated lens, however, this space requirement increases, because in such case the light-emitting diode chip is usually mounted in a housing that requires a larger area. The lens is then placed on or in the housing, which should be optically coupled to the light-emitting diode chip via an air gap to increase optical efficiency, but without excessive offset and without excessive stray light emission. However, for many lighting applications, light sources, especially light sources with integrated lenses, with a compact design are desirable.

SUMMARY

Embodiments provide a light-emitting device. Further embodiments provide a method for manufacturing a light-emitting device.

According to at least one embodiment, a light-emitting device has a light-emitting semiconductor chip. In particular, the light-emitting semiconductor chip has a semiconductor layer sequence with an active region for generating light. In particular, the active region can have an active layer in which the light is generated during operation. The semiconductor layer sequence can preferably be grown on a growth substrate by means of an epitaxial process, for example, by means of metalorganic vapor phase epitaxy (MOVPE) or molecular beam epitaxy (MBE). The semiconductor layer sequence comprises semiconductor layers stacked on top of each other along an arrangement direction which is given by the growth direction. The layers of the semiconductor layer sequence each have a main extension plane perpendicular to the arrangement direction. In the following, directions parallel to the main extension plane of the semiconductor layers are referred to as lateral directions and directions perpendicular to the main extension plane are referred to as vertical directions.

According to at least one further embodiment, in a method for manufacturing a light-emitting device at least one light-emitting semiconductor chip is provided. The features and embodiments described above and below apply equally to the light-emitting device and to the method for manufacturing the light-emitting device.

The light-emitting semiconductor chip has a light-outcoupling surface via which the light generated during operation of the light-emitting device is emitted. In particular, the light-outcoupling surface may be a main surface of the semiconductor chip arranged perpendicular to the growth direction of the semiconductor layer sequence. Furthermore, the semiconductor chip has a rear side opposite the light-outcoupling surface. The light-outcoupling surface and the rear side are connected by side surfaces. In addition to the emission of light through the light-outcoupling surface, the light generated during operation in the active layer can also be emitted at least partially through side surfaces and/or the rear side.

Depending on the light to be generated, the light-emitting semiconductor chip may have a semiconductor layer sequence based on different semiconductor material systems. For example, a semiconductor layer sequence based on $In_xGa_yAl_{1-x-y}As$ is suitable for long-wave radiation, for instance infrared to red radiation, a semiconductor layer sequence based on $In_xGa_yAl_{1-x-y}P$ is suitable for red to green radiation, and a semiconductor layer sequence based on $In_xGa_yAl_{1-x-y}N$ is suitable for shorter-wave visible radiation, for instance green to blue radiation, and/or for UV radiation, with $0 \leq x \leq 1$ and $0 \leq y \leq 1$ respectively.

The growth substrate may comprise or be an insulator material or a semiconductor material, such as a compound semiconductor material system mentioned above. In particular, the growth substrate may comprise or be of sapphire, GaAs, GaP, GaN, InP, SiC, Si and/or Ge. The growth process can take place particularly in a wafer composite. In other words, a growth substrate is provided in the form of a wafer on which the semiconductor layer sequence is grown in a large-area fashion. In a further method step, the grown semiconductor layer sequence can be separated into individual semiconductor chips, wherein the side surfaces of the semiconductor chips can be formed by the separation. Furthermore, the semiconductor layer sequence can be transferred to a carrier substrate and the growth substrate can be at least partially or completely removed.

The semiconductor layer sequence of the light-emitting semiconductor chip may have an active region for generating light, such as a conventional pn junction-, a double heterostructure, a single quantum well structure (SQW structure) or a multiple quantum well structure (MQW structure). The semiconductor layer sequence may include other functional layers and functional areas in addition to the active region, such as p- or n-doped carrier transport layers, undoped or p-doped or n-doped confinement, cladding or waveguide layers, barrier layers, planarization layers, buffer layers, protective layers and/or electrodes, and combinations thereof. In particular, the light-emitting semiconductor chip can have electrical contacts, for example, in the form of electrode layers, on the rear side opposite the light-outcoupling surface for electrical contacting the chip. In particular, the light-emitting semiconductor chip can be embodied as a so-called flip chip which can be mounted and electrically contacted on a contact carrier, for example, a housing or a printed circuit board, by means of contacts which are arranged on a side facing away from a substrate, so that the light-outcoupling surface, which can preferably be formed by a surface of the substrate facing away from the semiconductor layer sequence, is arranged facing away from the contact carrier. The structures described here concerning the light-emitting semiconductor chip, in particular with regard to design, function and structure, are known to a person skilled in the art and are therefore not explained in detail here.

According to a further embodiment, the light-emitting device comprises a frame element that laterally surrounds the light-emitting semiconductor chip in a form-locking manner. This can in particular mean that the frame element is applied directly on the side surfaces of the semiconductor chip. For this purpose, the frame element can form a molded body, i.e., a body which is applied by a molding method, which directly covers the side surfaces of the semiconductor chip in a form-locking manner. In particular, the frame element is molded onto the light-emitting semiconductor chip and encloses the light-emitting semiconductor chip on all sides in the lateral direction. In other words, the frame element can form a molded body which is arranged around the semiconductor chip when seen from a top view onto the light-outcoupling surface of the semiconductor chip and which is formed in particular on all side surfaces of the light-emitting semiconductor chip. Consequently, the frame element laterally encapsulates the light-emitting semiconductor chip. In particular, the frame element is embodied in such a way that the light-outcoupling surface of the light-emitting semiconductor chip is not covered. The side surfaces of the light-emitting semiconductor chip may preferably be completely covered by the frame element. Furthermore, the rear side of the light-emitting semiconductor chip may be at least partially free of the frame element; in particular, contacts for the electrical connection of the light-emitting semiconductor chip on the rear side may be free of the frame element.

The frame element can be manufactured in particular by applying a frame material. The frame element may, for example, be produced by applying the frame material in a molding process, whereby here and in the following the term molding process may include methods such as casting, spraying, pressing, laminating a film and the like. The molding process is particularly preferably a foil-assisted molding process in which a foil is used as sealing means against a molding tool. For example, the molded body may be formed by a transfer molding process, such as a foil-assisted transfer molding process, or by a compression molding process, or by casting. The frame material can be cured during or after application, if necessary.

The frame material and thus the frame element can have a matrix material, preferably a plastic material such as silicone, epoxy or an epoxy-silicone hybrid material. Furthermore, the frame material and thus the frame element may contain additives such as particles in the matrix material. For example, the frame material and thus the frame element may comprise or consist of a silicone and/or epoxy filled with particles such as $TiO_2$ and/or $SiO_2$ particles. Due to the additives in the matrix material, the frame element can be at least partially optically reflective for the light generated in the light-emitting semiconductor chip during operation. Light emitted at the side surfaces of the light-emitting semiconductor chip can thus be reflected at least partially by the frame element. Furthermore, the frame element, which has side surfaces facing away from the semiconductor chip, can form a mechanically stabilizing element that promotes or substantially affects the stability of the light-emitting device.

According to a further embodiment, the light-emitting device comprises a wavelength conversion element on the light-emitting semiconductor chip. In particular, the wavelength conversion element can be arranged directly on the light-emitting surface of the light-emitting semiconductor chip. It can be particularly advantageous when the wavelength conversion element at least partially adheres to the light-outcoupling surface by means of adhesive forces, e.g., by means of an adhesive layer. The wavelength conversion element can preferably not project laterally beyond the light-outcoupling surface.

The wavelength conversion element, together with the light-emitting semiconductor chip, can preferably be laterally encapsulated by the frame element in a form-locking manner. For this purpose, the light-emitting semiconductor chip can be provided together with the wavelength conversion element and surrounded with the frame material by a molding process to form the frame element as described above.

According to a further embodiment, the wavelength conversion element has a plastic material. In particular, the plastic material may be at least partially transparent to the light generated by the light-emitting semiconductor chip during operation, so that correspondingly the wavelength conversion element may be at least partially transparent. The plastic material may, for example, comprise siloxanes, epoxides, acrylates, methyl methacrylates, imides, carbonates, olefins, styrenes, urethanes or derivatives thereof in the form of monomers, oligomers or polymers, as well as mixtures, copolymers or compounds thereof. For example, the matrix material may comprise or be an epoxy resin, polymethyl methacrylate (PMMA), polystyrene, polycarbonate, polyacrylate, polyurethane or a silicone resin such as polysiloxane or mixtures thereof.

Furthermore, the wavelength conversion element may comprise at least one or more wavelength conversion materials capable of at least partially converting the light emitted by the light-emitting semiconductor chip during operation into light of a different wavelength, such that the light-emitting device is capable of emitting a mixed light comprising the light primarily emitted by the semiconductor chip and the converted secondary light or, upon complete conversion of the light emitted by the semiconductor chip, substantially the converted light. For example, the wavelength conversion material(s) may comprise one or more of the following materials: garnets of rare earths and alkaline earth metals, nitrides, nitridosilicates, siones, sialons, aluminates, oxides, halophosphates, orthosilicates, sulfides, vanadates and chlorosilicates. Furthermore, the wavelength conversion material(s) may additionally or alternatively comprise an organic material which may be selected from a group comprising perylenes, benzopyrenes, coumarins, rhodamines and azo dyes.

The wavelength conversion material(s) can be distributed in the plastic material homogeneously or, for example, in layers. Accordingly, the wavelength conversion element can also be multi-layered and, for example, have a layer that comprises one or more wavelength conversion materials and another layer that is free of wavelength conversion materials. As an alternative to a plastic material, the wavelength conversion element may, for example, also comprise a ceramic material comprising one or more wavelength conversion materials or being formed by one or more wavelength conversion materials.

According to a further embodiment, the light-emitting device has an optical element over the light-outcoupling surface of the light-emitting semiconductor chip. The optical element can, for example, be a lens element and have a top side, facing away from the light-emitting semiconductor chip, wherein in the top side a lens structure is present. The optical element may, for example, comprise glass and/or plastic and, particularly preferably, may be optically clear. The optical element can be mounted, particularly preferably, on the frame element and, in this case, can be, particularly preferably, at least partially arranged directly on the frame element. This can also mean that the optical element adheres to the frame element by means of adhesive forces. For example, the optical element can be mounted to the frame element by means of an adhesive.

According to a further embodiment, a gap is present at least in a partial region between the light-outcoupling surface and the optical element. The optical element may have a bottom side facing the semiconductor chip, wherein the light-emitting surface of the light-emitting semiconductor chip and the bottom side of the optical element are at least partially spaced from each other to form the gap. In particular, the gap may be gas-filled, e.g., air-filled. If the light-emitting device has a wavelength conversion element on the light-emitting semiconductor chip, the gap may be present between the wavelength conversion element and the optical element. The wavelength conversion element may have a top side remote from the semiconductor chip and the optical element may have a bottom side facing the semiconductor chip, the top side of the wavelength conversion element and the bottom side of the optical element being at least partially spaced apart to form the gap. For example, the optical element may also have a recess in the bottom side, wherein the recess is surrounded by an edge. With the edge, the optical element can rest on the frame element, while the recess forms at least part of the gap between the light-outcoupling surface or the wavelength conversion element and the optical element. In particular, the gap can also be adhesive-free. The edge can be adhered to the frame element, which can mean that an adhesive is arranged between the edge and the frame element. In other words, the optical element can be fixed to the frame element by means of an adhesive between the edge and the frame element. The gas-filled gap can improve the light coupling from the light-outcoupling surface and/or the wavelength conversion element into the optical element.

According to a further embodiment, the frame element projects beyond the light-outcoupling surface of the light-emitting semiconductor chip in a vertical direction in such a way that the gas-filled gap between the light-outcoupling surface and the optical element is present at least in a partial region. In other words, the frame element protrudes vertically in relation to the light-outcoupling surface. If the light-emitting device has a wavelength conversion element on the light-emitting semiconductor chip, the frame element can in particular also project beyond the wavelength conversion element in a vertical direction in such a way that the gas-filled gap is present at least in a partial region between the wavelength conversion element and the optical element.

According to a further embodiment, the frame element has a channel that connects the gap with an atmosphere surrounding the light-emitting device. The channel can therefore also be denoted as a ventilation opening. The channel can be used to ensure gas exchange between the environment and the gap, so that the formation of a closed microclimate in the gap can be avoided. In particular, the channel can be embodied as a recess, e.g., as a groove or trench, in a top side of the frame element facing away from the light-emitting semiconductor chip in the vertical direction. Furthermore, the frame element may have at least two channels formed in laterally opposite side walls of the frame element.

For the manufacturing of the light-emitting device, in particular a plurality of light-emitting semiconductor chips can be provided, which are together surrounded with the frame material by molding. For this purpose, the light-emitting semiconductor chips can be arranged on a temporary carrier. In particular, the light-emitting semiconductor chips can be embodied as flip chips and can be arranged on the carrier with their rear sides which is provided with the contacts, so that the light-outcoupling surfaces of the light-emitting semiconductor chips are facing away from the temporary carrier. The temporary carrier can, for example, be a semiconductor carrier, metal carrier, plastic carrier and/or ceramic carrier on which the light-emitting semiconductor chips are temporarily attached, which means that they can be detached again without destruction. For example, an adhesive foil can be applied to the temporary carrier to which the light-emitting semiconductor chips adhere for the following method steps. By laterally enveloping the light-emitting semiconductor chips with the frame material, in particular by means of one of the methods described above, the frame material can be formed laterally onto the light-emitting semiconductor chips so that the frame material laterally surrounds each of the light-emitting semiconductor chips in a form-locking manner. After application and curing, the frame material thus forms a continuous body on the temporary carrier in which the light-emitting semiconductor chips are arranged. As described above, this may also apply in the case that the light-emitting semiconductor chips are each provided with a wavelength conversion element on the light-outcoupling surface of the temporary carrier.

According to a further embodiment, the frame material is severed to form a plurality of frame elements of the later correspondingly separated light-emitting devices. Severing can be done, for example, by sawing. For this purpose, the frame material can be completely severed between the light-emitting semiconductor chips. In particular, before, during or after severing the frame material to form the frame elements, channels may also be formed in such a way that each frame element has at least one channel. In this case, the frame material can be sawn to a depth which, seen from the top side of the frame material, is less than the height between the top side and the light-outcoupling surface or wavelength conversion element. The severing and forming of the channels can be carried out in a respective single sawing step or in a common sawing step, for example, by using different sawing tools one after the other or at the same time. Due to the severing, laterally bounding side surfaces of the later finished light-emitting devices are formed.

As an alternative to forming the channels by a sawing step, they can also be formed as part of the molding process for applying the frame material. For this purpose, for example, a mold may be used which has corresponding elevations corresponding to a negative shape of the channels.

Furthermore, a plurality of optical elements can be applied to the majority of the frame elements. In particular, the optical elements can be applied in such a way that exactly one optical element is assigned to exactly one light-emitting semiconductor chip. By forming the channels in the frame elements, it is possible to ensure that no gas is trapped between the light-emitting semiconductor chips and the optical elements which would form a closed microclimate when the optical elements are mounted. By applying the optical elements, a large number of light-emitting devices can be completed on the temporary carrier.

In order for the frame element to project vertically beyond the light-emitting surface of the light-emitting semiconductor chip as described above, a suitably shaped molding tool can be used to apply the frame material, by means of which the frame material, viewed from the temporary carrier, is formed with a greater height than the light-outcoupling surface or the top side of the wavelength conversion elements. Furthermore, it may also be possible that temporary coatings are applied to the light-outcoupling surfaces or to the wavelength-conversion elements if applicable, before the light-emitting semiconductor chips are laterally surrounded with the frame material by means of the molding process, wherein the temporary coatings are surrounded with the frame material by the molding process together with the light-emitting semiconductor chips and, if applicable, together with the wavelength-conversion elements. After the lateral encapsulating with the frame material, the frame material can surround the temporary coatings laterally in a form-locking manner and terminate flush with the temporary coatings in a vertical direction. The temporary coatings can be removed before the optical elements are arranged. The temporary coatings can be formed by a plastic material such as a photoresist or a polyvinyl alcohol resist.

In addition, further method steps can be carried out, for example, thermal debonding of the light-emitting devices from the temporary carrier and/or re-lamination and plasma treatment steps such as plasma glazing, in particular $O_2$ plasma glazing. This can, for example, reduce the stickiness of silicone in the frame material. Furthermore, a so-called deflashing can be carried out, for example, immediately after the application of the frame material, in order to remove unwanted frame material residues, for example, from the light-outcoupling surfaces or the wavelength conversion elements. In addition, being arranged in a foil composite the devices can be tested and sorted and then arranged on tapes in the usual way ("taping").

The light-emitting device described here can be characterized by a very compact design, especially by a small footprint and a low height, which can be produced in an efficient and cost-effective process, because many batch processes can be used. The light-emitting device may be particularly suitable for applications where small dimensions and compact forms are advantageous and where small size resulting in an almost-invisibility can be advantageous. For example, these can be flash applications, especially in mobile phones, i.e., for front and rear flash applications. Furthermore, these can be so-called wearable applications, i.e., applications in fitness trackers and similar bio-monitoring devices, as well as LCD backlighting applications. In particular, the light-emitting device can also be manufactured in the described manner with a plurality of light-emitting semiconductor chips, so that substrate- or carrier-less multichip devices can be manufactured for the applications mentioned in the described manner.

BRIEF DESCRIPTION OF THE DRAWINGS

Further advantages, advantageous embodiments and further developments are revealed by the embodiments described below in connection with the figures, in which.

Figure 1A:
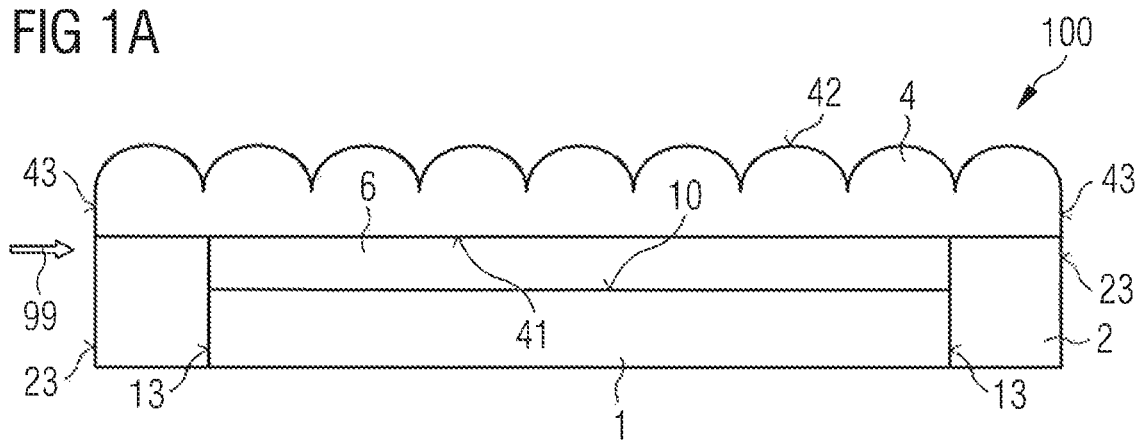
FIGS. 1A and 1B show schematic illustrations of a light-emitting device according to an embodiment.

In the embodiments and figures, identical, similar or identically acting elements are provided in each case with the same reference numerals. The elements illustrated and their size ratios to one another should not be regarded as being to scale, but rather individual elements, such as, for example, layers, components, devices and regions, may have been made exaggeratedly large to illustrate them better and/or to aid comprehension.

DETAILED DESCRIPTION OF ILLUSTRATIVE EMBODIMENTS

Figure 1B:
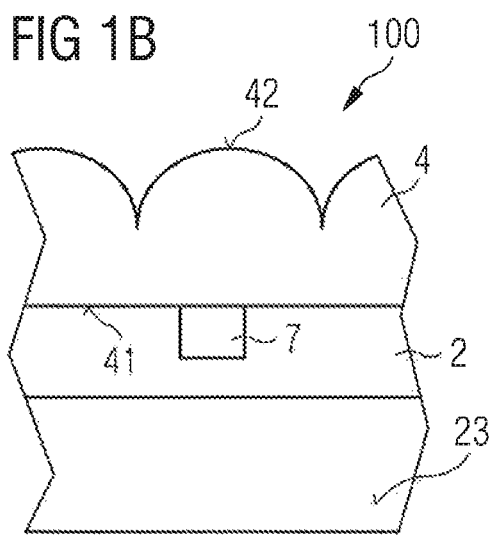

FIGS. 1A and 1B show an embodiment of a light-emitting device 100. FIG. 1A shows a schematic cross-section of device 100, while FIG. 1B shows a view of device 100 from the direction 99 indicated in FIG. 1A. The following description refers equally to FIGS. 1A and 1B.

The light-emitting device 100 has a light-emitting semiconductor chip 1. The light-emitting semiconductor chip 1 has a semiconductor body with a light-emitting layer. The light generated during operation can be emitted via a light-outcoupling surface 10. In addition, the light-emitting semiconductor chip 1 has a rear side opposite the light-outcoupling surface 10 as well as side surfaces 13 connecting the light-outcoupling surface 10 and the rear side.

The light-emitting device 100 also has a frame element 2, which surrounds the light-emitting semiconductor chip 1 in the lateral direction in a form-locking manner. For this purpose, the frame element 2 is embodied as a molded body which covers the side faces 13 of the semiconductor chip 1 directly and in a form-locking manner. The frame element 2 is formed in particular on the light-emitting semiconductor chip 1 and encloses the light-emitting semiconductor chip 1 on all sides in the lateral direction, with the light-outcoupling surface 10 being free of the frame element 2. As shown, the side surfaces 13 of the light-emitting semiconductor chip 1 are preferably completely covered by the frame element 2.

The light-emitting device 100 also has an optical element 4 above the light-outcoupling surface 10 and at a distance from it. The optical element 4 is mounted directly on the frame element 2. For example, the optical element 4 may be attached to the frame element 2 by means of an adhesive (not shown). The frame element 2 has side surfaces 23 facing away from the light-emitting semiconductor chip 1, which together with corresponding side surfaces 43 delimiting the optical element 4 in the lateral direction form the lateral outer surfaces of the light-emitting device 100. As shown in FIG. 1A, the lateral outer surfaces are particularly preferably flat, so that the light-emitting device 100 can, for example, be processed in a pick-and-place process.

As indicated in FIG. 1, the optical element 4 can be particularly preferably designed as a lens element and have a top side 42 with a lens structure facing away from the light-emitting semiconductor chip 1. Optical element 4, which may be formed as one-piece or multi-piece, may comprise, for example, glass and/or plastic and may be particularly optically clear. The lens structure on the top side 42 can be a microlens array, for example. Furthermore, below the lens structure there may be a film or a coating with openings assigned to the individual lens elements, which act as apertures and promote light radiation in the forward direction. In this case, the optical element may preferably have a substrate part on which the aperture structure is applied. The lens structure can, for example, be arranged on the substrate part by means of a molding process.

Between the light-outcoupling surface 10 of the light-emitting semiconductor chip 1 and the optical element 4 a gap 6 is present at least in a partial region. As indicated in FIG. 1A, the optical element 4 has a bottom side 41 facing the semiconductor chip 1, wherein the light-outcoupling surface 10 of the light-emitting semiconductor chip 1 and the bottom side 41 of the optical element 4 are at least partially spaced from each other to form the gap 6. The gap 6 is gas-filled, especially, for example, air-filled. In particular, the gap 6 can also be adhesive-free. Due to the gas-filled gap 6, the light coupling from the light-outcoupling surface 10 into the optical element 4 can be improved. To form the gap 6, the frame element 2 projects above the light-outcoupling surface 10 of the light-emitting semiconductor chip 1 in a vertical direction. This means that the frame element 2 protrudes vertically in relation to the light-outcoupling surface 10.

Furthermore, the frame element 2 has a channel 7 which connects the gap 6 with an atmosphere surrounding the light-emitting device 1. The channel 7, which thus functions as a ventilation opening, prevents the formation of a closed microclimate in the gap 6. As indicated in FIG. 1B, the channel 7 is in particular a recess, i.e., a groove or trench, in a top side of the frame element 2, facing away from light-emitting semiconductor chip 1 in the vertical direction. The frame element 2 may have a channel 7 in at least one of its side walls formed on the side surfaces 13 of the semiconductor chip 1. Furthermore, the frame element 2 can also have at least two channels, which, for example, can be formed in laterally opposite side walls of the frame element 2.

The following figures show modifications and further developments of the embodiment described in connection with FIGS. 1A and 1B. The description of the following embodiments therefore mainly concentrates on the differences to the previous embodiments.

Figure 2:
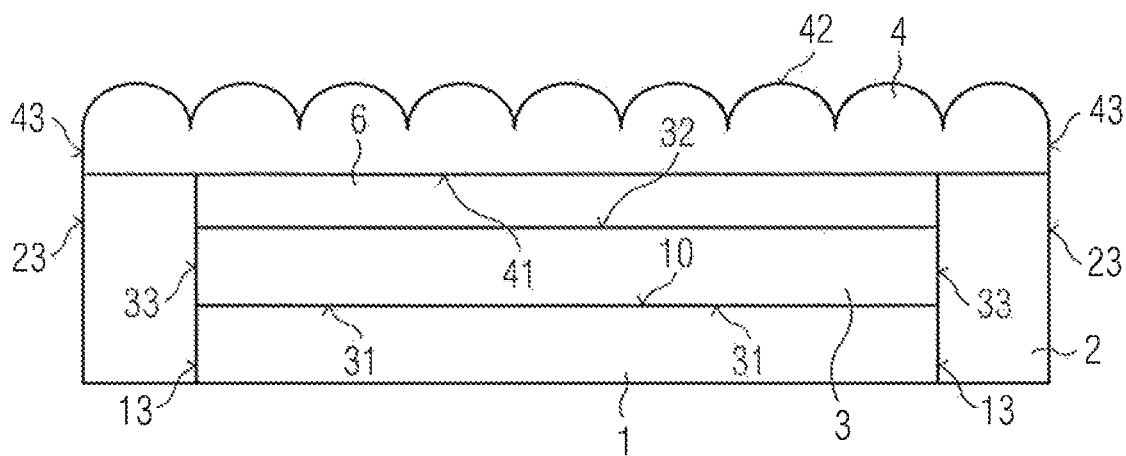
FIGS. 2 and 3 show schematic illustrations of light-emitting devices according to further embodiments.

FIG. 2 shows a further embodiment of a light-emitting device wo which, compared to the previous example, additionally comprises a wavelength conversion element 3 on the semiconductor chip 1.

The wavelength conversion element 3 has a bottom side 31 facing the semiconductor chip 1 and is preferably arranged with the bottom side 31 directly on the light-outcoupling surface 10 of the light-emitting semiconductor chip 1, for example, by means of an adhesive layer (not shown) or by being embodied as a self-adhesive layer. The wavelength conversion element 3 has a top side 32 facing away from the semiconductor chip 1 and side surfaces 33 which do not project laterally beyond the light-outcoupling surface 10 and thus the side surfaces 13 of the semiconductor chip 1. As shown, the wavelength conversion element 3, together with the light-emitting semiconductor chip 1, is surrounded laterally by the frame element 2 in a form-locking manner. For this purpose, the light-emitting semiconductor chip 1 can be provided together with the wavelength conversion element 3 and surrounded by molding with the frame element 2.

The gap 6 is formed between the wavelength conversion element 3 and the optical element 4, i.e., between the top side 32 of the wavelength conversion element 3 and the bottom side 41 of the optical element 4, which are at least partially spaced from each other to form the gap 6. In this embodiment, the frame element 2 correspondingly projects above wavelength conversion element 3 in a vertical direction to form the gap 6.

Figure 3:
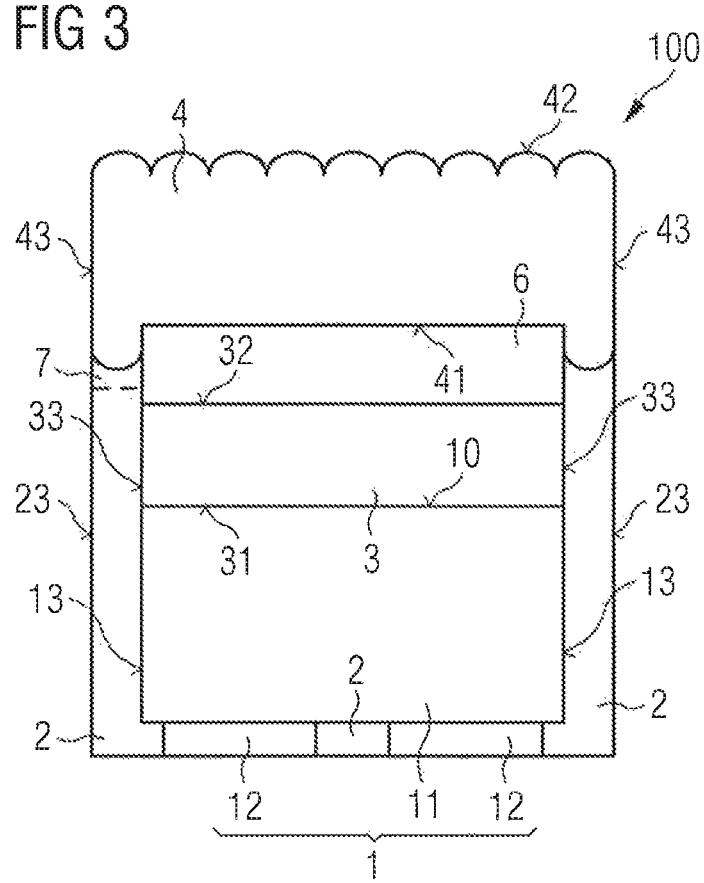

FIG. 3 shows another embodiment of a light-emitting device wo in which the light-emitting semiconductor chip 1 is embodied as a flip chip. The semiconductor chip 1 has a semiconductor body 11 with a semiconductor layer sequence with an active region for generating light, which can be emitted via the light-outcoupling surface 10. In addition, it may also be possible for light to be emitted during operation via the rear side opposite the light-outcoupling surface 10 and/or via the side surfaces 13 delimiting the semiconductor chip 1 in the lateral direction. Depending on the light to be generated, the light-emitting semiconductor chip 1 may have a semiconductor layer sequence based on various semiconductor material systems, such as, for example, InAlGaN, InAlGaP and/or InAlGaAs. The light-emitting semiconductor chip 1 also has contacts 12 for mounting and electrical connection on the rear side opposite the light-outcoupling surface 10. The light-outcoupling surface 10 can, for example, be a surface of a substrate such as a sapphire substrate on which the semiconductor layer sequence is applied. Alternatively, other chip designs are also possible.

As shown in FIG. 3, material of the frame element 2 may also be present on the rear side opposite the light-outcoupling surface 10, wherein at least the contacts 12 are free of the material of the frame element 2 in such a way that electrical connection and mounting of the light-emitting device 100 is possible. Consequently, as shown the frame element 2 can partly cover the rear side.

As in the previous embodiment, the light-emitting device 100 of the embodiment shown in FIG. 3 has a wavelength conversion element 3. Alternatively, no wavelength conversion element can be present. The wavelength conversion element 3 comprises at least one or more wavelength conversion materials capable of at least partially converting the light emitted by the light-emitting semiconductor chip 1 into a light of a different wavelength. In this case, depending on the degree of conversion, the light-emitting device 100 can emit a mixed light, which can be given by the light generated directly by the semiconductor chip 1 and by the conversion light generated by the wavelength conversion element 3 by converting part of the first-mentioned light. In the case of so-called full conversion, substantially all the light generated by semiconductor chip 1 can be converted by the wavelength conversion element 3, so that in this case essentially only conversion light is emitted by the light-emitting device 100 during operation. For example, the light-emitting semiconductor chip 1 can emit blue light, while the wavelength conversion element 3 has as wavelength conversion material at least one garnet such as yttrium aluminum oxide (YAG) and/or a nitride phosphor to convert part of the blue light into yellow to green and/or red light, so that the light-emitting device 100 can emit white light as mixed light. Alternatively, other wavelength conversion materials and combinations thereof as mentioned in the general part are also possible.

Compared to the two previous embodiments, optical element 4 has a recess surrounded by an edge on the bottom side 41. With the edge, the optical element 4 can rest on the frame element 2, while the recess forms at least part of the gap 6 between the light-outcoupling surface 10 or the wavelength conversion element 3 and the optical element 4. With the edge, the optical element 4 can be adhered to the frame element 2, which can mean that an adhesive is arranged between the edge and the frame element 2.

The frame element 2 has a matrix material, which in particular can be silicone in the embodiment shown. Furthermore, the frame element 2 has additives in the form of particles in the matrix material, by means of which the reflectivity of the frame element 2 can be caused or increased. In particular, frame element 2 in the embodiment shown can be a silicone filled with $TiO_2$ particles.

Light which emerges during operation of the light-emitting device 100 at the side surfaces 13 and/or at the rear side of the light-emitting semiconductor chip 1 opposite the light-outcoupling surface 10, can be scattered by the frame element 2 and at least partially reflected, so that scattering radiation emerging in the lateral direction can be reduced or completely prevented. It can be particularly advantageous if the thickness of the frame element 2 in the lateral direction is greater than or equal to 200 µm.

FIGS. 4A to 4I show method steps of a method for manufacturing a light-emitting device 100, which is embodied according to the previous embodiments. In particular, several light-emitting devices 100 are produced simultaneously in a composite process.

Figure 4A:
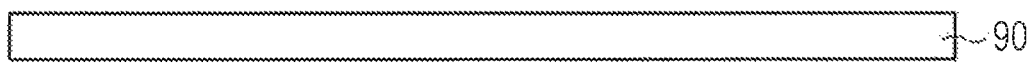
FIGS. 4A to 4I show schematic illustrations of method steps of a method for manufacturing a light-emitting device according to a further embodiment.
Figure 4B:
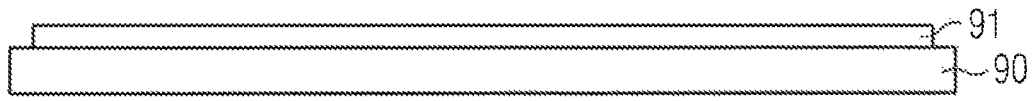

As shown in FIG. 4A, a temporary carrier 90 is provided for this purpose in a first method step. The temporary carrier 90 can, for example, be a semiconductor carrier, metal carrier, plastic carrier and/or ceramic carrier, for example, in a size common in semiconductor technology with a diameter of 4 inches, on which a number of light-emitting semiconductor chips can be attached temporarily, i.e., non-destructively removable. As shown in FIG. 4B, for that purpose a suitable adhesive film 91 can be applied to the temporary carrier 90. For example, the adhesive film 91 can be embodied as a double-sided adhesive film, which is laminated onto the temporary carrier 90 and permits subsequent non-destructive removal of devices.

Figure 4C:
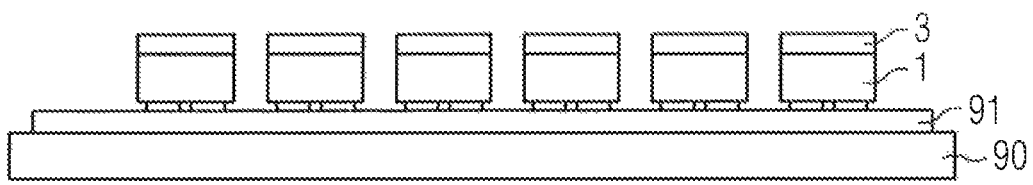

As shown in FIG. 4C, in a further method step, light-emitting semiconductor chips 1 are arranged at a distance from each other on the temporary carrier 90. In particular, the light-emitting semiconductor chips 1 are applied, with the rear side provided with the contacts, to the carrier 90 or the adhesive film 91, so that the light-outcoupling surfaces of the light-emitting semiconductor chips 1 are directed away from the temporary carrier 90.

In the shown embodiment, the light-emitting semiconductor chips 1 are provided with wavelength conversion elements 3 and arranged on the temporary carrier 90. The further description also applies to the case that the light-emitting semiconductor chips 1 are provided without wavelength conversion element 3.

Figure 4D:
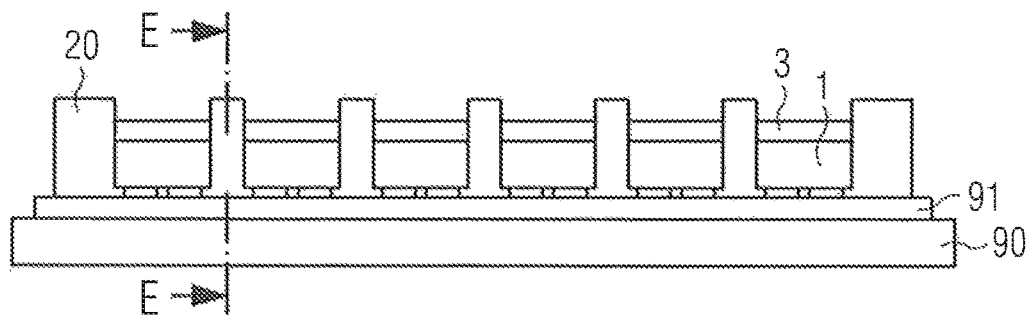

In a further method step, the semiconductor chips 1, as shown in FIG. 4D, are laterally coated with a frame material 20, so that the frame material 20 is formed laterally onto the light-emitting semiconductor chips 1. Thus, the semiconductor chips 1 are each surrounded by the frame material 20 laterally in a form-locking manner. As described above, the frame material 20 may comprise a silicone matrix material comprising particles such as $TiO_2$ particles. Other materials as described in the general part are also possible.

The frame material 20 can be applied, as described in the general part, by casting, spraying, pressing, laminating a foil or the like. A foil-assisted molding process can be used in particular, with subsequent deflashing if necessary. In particular, the use of a foil in the molding process can achieve a seal on the top sides of the wavelength conversion elements 3. The molding tool is designed in such a way that the frame material 20, after being applied, projects in the vertical direction above the semiconductor chips 1 with the wavelength conversion elements 3. During the molding process, the frame material 20 can also be applied to the rear sides of the semiconductor chips 1 in spaces between the adhesive foil 91 and the semiconductor chips 1. During or after the application of the frame material 20, the frame material 20 is cured so that the frame material 20 forms a continuous body on the temporary carrier 90 in which the light-emitting semiconductor chips 1 are arranged and fixed.

Figure 4E:
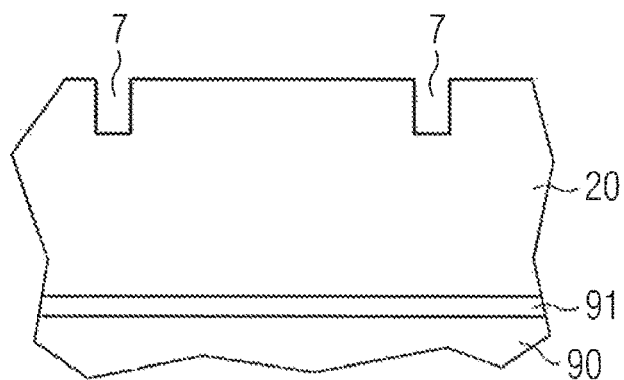

For the molding process, a mold is used which has suitable bulges, for example, in the form of island-like or web-like elevations. This allows the formation of channels in the frame material 20, which can be, as described above, the frame elements in the frame elements of the later-completed light-emitting devices. FIG. 4E shows a section along the section plane EE shown in FIG. 4D, in which the channels 7 in the frame material 20 are recognizable.

Figure 4F:
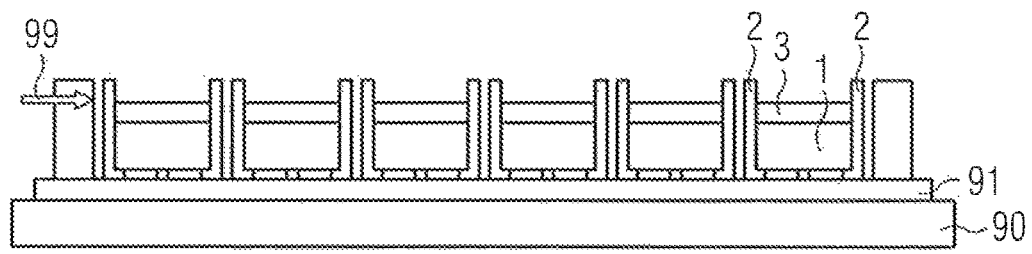
Figure 4G:
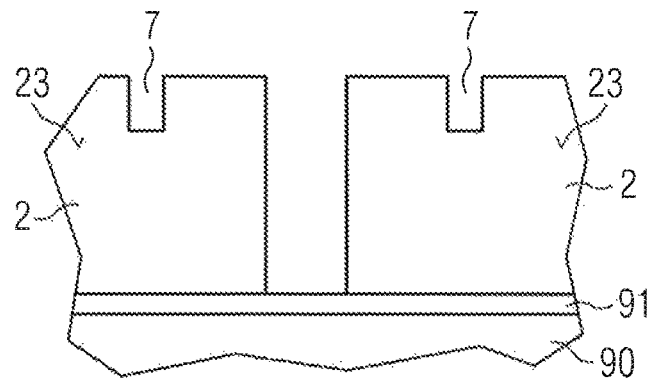

As shown in FIG. 4F, the frame material 20 is then severed between the semiconductor chips 1 to form the frame elements 2. The temporary carrier 90 can have suitable markings for this purpose, for example. By the severing, side surfaces of the frame elements 2 are formed, which are parts of the laterally delimiting side faces of the later finished light-emitting devices 100 as described above in connection with the previous figures. FIG. 4G shows a partial view along the viewing direction 99 indicated in FIG. 4F on side surfaces 23 of frame elements 2.

Figure 4H:
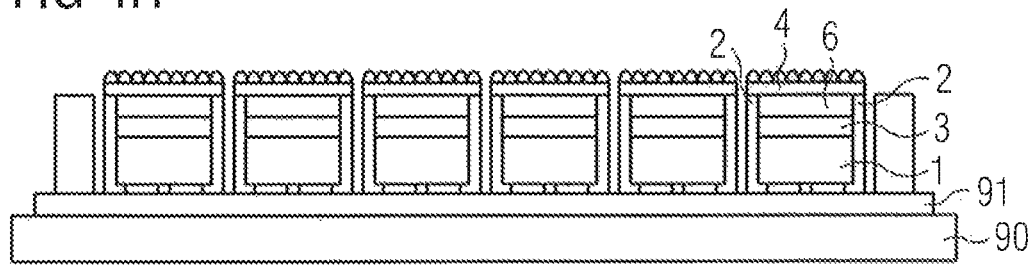
Figure 4I:
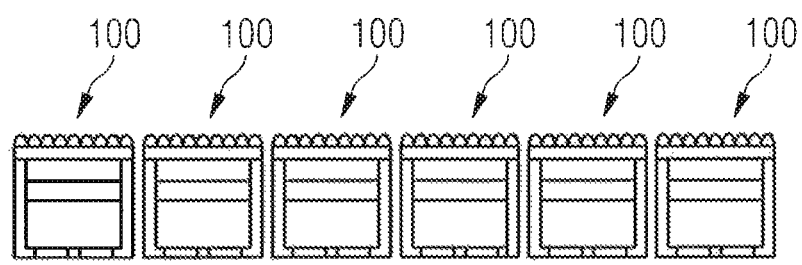

Then, as shown in FIG. 4H, a plurality of optical elements 4 are applied to the plurality of frame elements 2 and mounted, for example, by means of an adhesive. Each of the optical elements 4 is assigned to exactly one light-emitting semiconductor chip 1.

Subsequently, the finished light-emitting devices 100 are detached from the temporary carrier 90, for example, by thermal separation. Further method steps can be carried out, for example, re-lamination and plasma treatment steps such as plasma glazing to reduce the tackiness of the silicone in the frame elements. In addition, testing and sorting of the devices 100 arranged in a film composite as well as a subsequent taping can be performed.

FIGS. 5A to 5E show the method steps of a method for manufacturing a light-emitting device 100, in particular a plurality of light-emitting devices, which comprises modifications compared to the previous embodiment.

Figure 5A:
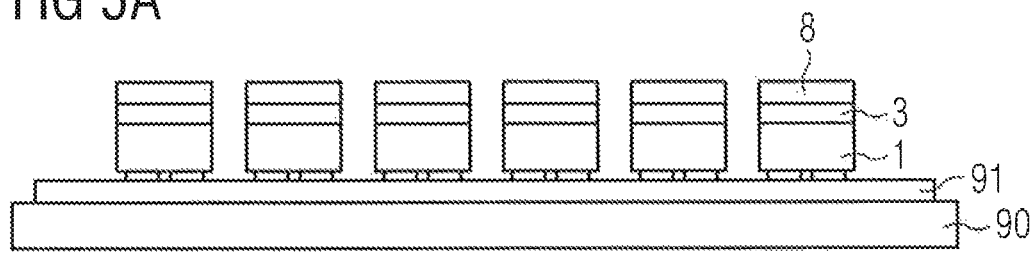
FIGS. 5A to 5E show schematic illustrations of method steps of a method for manufacturing a light-emitting device according to a further embodiment.

As in case of the method described previously, a temporary carrier 90 is provided with an adhesive film 91 on which light-emitting semiconductor chips 1 are arranged. As in the previous embodiment, the semiconductor chips 1 can each be provided with a wavelength conversion element 3. Alternatively, it is also possible that semiconductor chips 1 without wavelength conversion elements 3 are provided and applied to the temporary carrier 90. In contrast to the previous embodiment, the semiconductor chips 1, as shown in FIG. 5A, are additionally provided with a temporary coating 8, which can be or comprise a plastic, especially a resist. Especially preferably, the temporary coating 8 is formed by a photoresist or a polyvinyl alcohol resist. The temporary coating 8 is applied over the entire surface on the top side of the wavelength conversion element 3 or, in the absence of a wavelength conversion element, over the entire surface on the light-outcoupling surface of the light-emitting semiconductor chips 1.

Figure 5B:
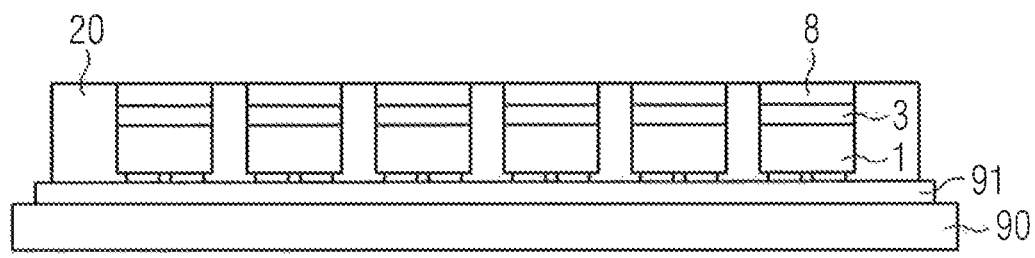

As shown in FIG. 5B, the semiconductor chips 1 are surrounded with a frame material 20 in the manner described above together with the wavelength conversion elements 3 and the temporary coatings 8, the frame material 20 having a height after application that is equal to the height of the top side of the temporary coating 8. The frame material 20 can thus surround the temporary coatings 8 laterally in a form-locking manner after the lateral surrounding and terminate flush with the temporary coatings 8 in a vertical direction. In comparison to the previous embodiment, a molding process such as casting can be used, since no structures need to be formed in the frame material during the molding process.

Figure 5C:
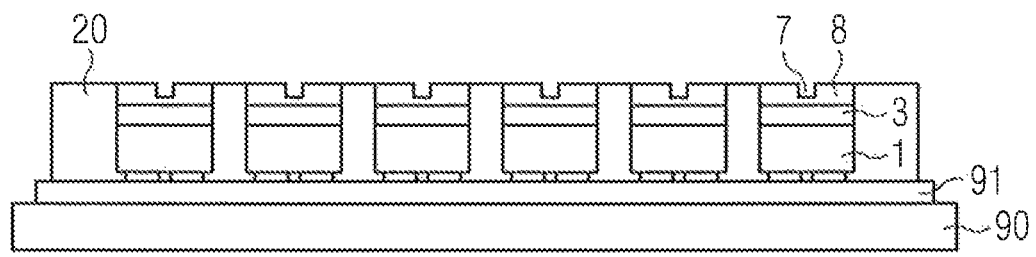
Figure 5D:
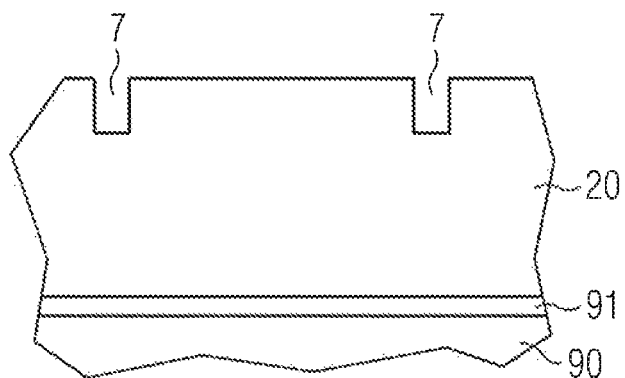

In a further method step, channels are inserted from the top side into the frame material 20 and into the temporary coatings 8, as shown in FIG. 5C, by means of a sawing process. FIG. 5D shows a corresponding section of the composite shown in FIG. 5C in a section plane parallel to the drawing plane, which lies between the light-emitting semiconductor chips and thus in the frame material 20.

Figure 5E:
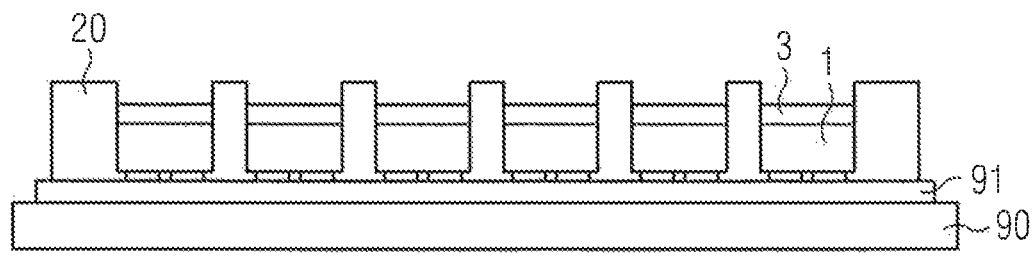

Then, as shown in FIG. 5E, the temporary coatings are removed, for example, by a photoresist stripping or, in the case of polyvinyl alcohol, by water. Subsequently, the method steps described in connection with FIGS. 4H and 4I for the completion of the light-emitting devices are carried out.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

What is claimed is:

1. A light-emitting device comprising:
   a light-emitting semiconductor chip having a light-outcoupling surface; and
   an optical element arranged on the light-outcoupling surface,
   wherein the light-emitting semiconductor chip is laterally surrounded by a frame element in a form-locking manner,
   wherein the optical element is mounted on the frame element,
   wherein the frame element projects beyond the light-outcoupling surface in a vertical direction such that a gas-filled gap is present at least in a partial region between the light-outcoupling surface and the optical element, and
   wherein the frame element has a channel connecting the gap to an atmosphere surrounding the light-emitting device.

2. The light-emitting device according to claim 1, further comprising a wavelength conversion element arranged on the light-outcoupling surface.

3. The light-emitting device according to claim 2, wherein the light-emitting semiconductor chip and the wavelength conversion element together are laterally surrounded by the frame element in a form-locking manner.

4. The light-emitting device according to claim 2, wherein the frame element projects beyond the wavelength conversion element in the vertical direction such that the gas-filled gap between the wavelength conversion element and the optical element is present at least in a partial region.

5. The light-emitting device according to claim 1, wherein the frame element comprises a reflective material.

6. The light-emitting device according to claim 1, wherein the frame element comprises a matrix material with particles in the matrix material.

7. The light-emitting device according to claim 1, wherein the optical element is fixed to the frame element by an adhesive.

8. The light-emitting device according to claim 1, wherein the optical element has a recess enclosed by an edge in a bottom side.

9. The light-emitting device according to claim 8, wherein the optical element rests with the edge on the frame element.

10. The light-emitting device according to claim 8, wherein the optical element is fixed to the frame element by an adhesive between the edge and the frame element.

11. The light-emitting device according to claim 1, wherein the optical element is a lens element.

12. The light-emitting device according to claim 1, wherein the gap is air-filled.

13. The light-emitting device according to claim 1, wherein the light-emitting semiconductor chip is a flip-chip configured to be electrically contacted on a rear side opposite the light-outcoupling surface.

14. The light-emitting device according to claim 13, wherein the frame element partly covers the rear side.

15. The light-emitting device according to claim 1, wherein the frame element completely covers all side surfaces of the light-emitting semiconductor chip.

* * * * *